(12) United States Patent
Minami et al.

(10) Patent No.: US 6,776,845 B2
(45) Date of Patent: Aug. 17, 2004

(54) COATING FILM FORMING METHOD AND SYSTEM

(75) Inventors: Tomohide Minami, Koshi-Machi (JP);
Shinichi Sugimoto, Kikuyo-Machi (JP);
Takahiro Kitano, Koshi-Machi (JP);
Jun Ookura, Koshi-Machi (JP);
Hiroaki Kurishima, Koshi-Machi (JP)

(73) Assignee: Tokyo Electron Limited, Tokyo-To (JP)

( * ) Notice: Subject to any disclaimer, the term of this patent is extended or adjusted under 35 U.S.C. 154(b) by 201 days.

(21) Appl. No.: 10/152,562

(22) Filed: May 23, 2002

(65) Prior Publication Data
US 2002/0176928 A1 Nov. 28, 2002

(30) Foreign Application Priority Data
May 24, 2001 (JP) ........................................ 2001-155231

(51) Int. Cl.[7] ........................ B05C 11/00; B05C 11/08; B05C 13/00; H01L 21/00; H01L 21/47
(52) U.S. Cl. ........................ 118/665; 118/669; 118/670; 118/680; 118/321; 118/713; 438/780; 438/782
(58) Field of Search ........................ 118/52, 62, 320, 118/322, 56, 680, 686, 682, 710, 713, 712, 663, 668, 669, 670, 665; 427/8, 240, 425, 340, 348; 438/750, 780, 782, 716, 758, 760; 239/443, 327, 750, 264, 524

(56) References Cited

U.S. PATENT DOCUMENTS

| | | | |
|---|---|---|---|
| 4,451,507 A | * 5/1984 | Beltz et al. | 427/240 |
| 4,564,280 A | * 1/1986 | Fukuda | 396/611 |
| 5,250,116 A | * 10/1993 | Tanimoto | 118/664 |
| 5,366,757 A | * 11/1994 | Lin | 427/9 |
| 5,646,071 A | * 7/1997 | Lin et al. | 438/763 |
| 5,720,814 A | * 2/1998 | Takagi et al. | 118/319 |
| 5,820,677 A | * 10/1998 | Yonaha | 118/680 |
| 5,885,661 A | * 3/1999 | Batchelder | 427/425 |
| 5,960,225 A | * 9/1999 | Fujimoto | 396/611 |
| 5,985,357 A | * 11/1999 | Sanada | 427/8 |
| 6,033,728 A | * 3/2000 | Kikuchi et al. | 427/240 |
| 6,270,579 B1 | * 8/2001 | Subramanian et al. | 118/663 |
| 6,284,044 B1 | * 9/2001 | Sakamoto et al. | 118/219 |
| 6,340,644 B1 | * 1/2002 | Becker et al. | 438/782 |
| 6,371,667 B1 | 4/2002 | Kitano et al. | 396/611 |
| 6,485,782 B2 | * 11/2002 | Takamori | 427/240 |
| 6,645,880 B1 | * 11/2003 | Shigemori et al. | 438/780 |
| 6,680,078 B2 | * 1/2004 | Davlin et al. | 427/8 |

* cited by examiner

Primary Examiner—J. A. Lorengo
(74) Attorney, Agent, or Firm—Oblon, Spivak, McClelland, Maier & Neustadt, P.C.

(57) ABSTRACT

When a coating film is formed on a substrate, the inplane uniformity of the thickness of the coating film is enhanced to improve through put. Above the substrate, there are provided main and auxiliary nozzles separately movable, and monitoring means for monitoring the state of the surface of the substrate to detect the occurrence of an uncoated region on the surface of the substrate. On the basis of previously prepared coating data, a coating liquid is spirally applied on the substrate by the main nozzle. Then, if the monitoring means detects the occurrence of the uncoated region in a coated region in which the coating liquid has been applied by the main nozzle, a control part detects whether it is required to supply the coating liquid to the uncoated region. If it is required, the coating liquid is supplied to the uncoated region by the auxiliary nozzle. On the other hand, the portion of occurrence of the uncoated region has been grasped by the control part. If the uncoated region is continuously detected at the same place with respect to two substrates, it is determined that the setting of coating data is erroneous, and this is modified.

3 Claims, 10 Drawing Sheets

SCANNING DIRECTION →

COATING FILM FORMING METHOD AND SYSTEM

BACKGROUND OF THE INVENTION

1. Technical Field of the Invention

The present invention relates generally to a method and system for applying a liquid, which contains a resin or the like dissolved in a solvent, e.g., a polyimide solution, on a substrate, such as a semiconductor wafer or an LCD substrate (a glass substrate for a liquid crystal display), to form a liquid film.

2. Description of Related Art

As one of semiconductor fabricating steps, there is a process for applying a polyimide on a substrate, such as a semiconductor wafer, in order to form a protective film or interlayer insulating film of a semiconductor device. In such a process, it is conventionally required that the thickness of a coating film formed on the surface of the substrate is uniform over the whole. In recent years, with the scale down of circuits and so forth, it is required that the inplane uniformity of the thickness of the film is higher than that of conventional films.

In the circumstance, as one of coating film forming systems, there has been studied a system for further diluting a chemical, which contains a polyimide dissolved in a solvent, to prepare a coating liquid and for rotating a semiconductor wafer (which will be hereinafter referred to as a wafer) as shown in, e.g., FIG. 11, to discharge the coating liquid 12 from a nozzle 11 onto the surface of the wafer W while gradually moving the nozzle 11 in a radial direction from the center of the wafer W, to spirally apply the coating liquid 12 in the same manner as a picture drawn with a single stroke of the brush.

In such a system, the lines of the spirally coating liquid are tightly arranged without providing gaps in radial directions of the wafer W to integrate the lines of the coating liquid, so that a coating film having a high inplane uniformity of thickness is formed. Specifically, for example, coating data including values, such as the rate of discharge of the coating liquid, the speed of rotation of the substrate, and the traveling speed of the nozzle, are prepared on the basis of previously measured data, and the coating liquid is applied on the basis of this data.

However, since the above described system uses a nozzle having a small diameter of, e.g., about 100 μm, cavitation occurs in the passage of the nozzle, and bubbles of the coating liquid generated by the cavitation are broken on the surface of the wafer W, so that there is a problem in that an uncoated region formed by breaking the lines of the coating liquid is generated. For that reason, for example, various measures to provide a degassing mechanism upstream of the nozzle for removing bubbles remaining in the coating liquid have been studied. However, the effects of all of the measures are insufficient.

Using a small-diameter nozzle, the width of the lines of the coating liquid applied on the wafer W is decreased. In order to tightly arrange such thin lines of the coating liquid, the nozzle must be very precisely moved with respect to the wafer W on the basis of the above described coating data. However, although the coating data have a predetermined error range every condition, if all values of the above described three conditions, e.g., the rate of discharge of the coating liquid, the speed of rotation of the substrate and the traveling speed of the nozzle, are values approximating the limit of error, the adjacent lines of the coating liquid are partially spaced from each other, so that there are some cases where a linear uncoated region is generated in each gap.

Moreover, although the coating liquid is applied so as to apparently draw a spiral, the nozzle does not spirally move in fact, and the position of the nozzle is changed by the balance between the rotation of the wafer W and the straight-line motion of the nozzle in radial directions of the wafer W. Therefore, the coating liquid on the wafer W varies slightly step-wise from a microscopic point of view, and if this step increases, a linear uncoated region is generated between the adjacent lines of the coating liquid.

SUMMARY OF THE INVENTION

The present invention has been made on the basis of the circumstances, and it is an object of the present invention to provide a technique for enhancing the inplane uniformity of the thickness of a coating film to improve throughput when the coating film is formed on a substrate.

A coating film forming method according to the present invention comprises: a first coating step of moving a nozzle, which is provided above a substrate, from the center of rotation of the substrate toward a peripheral edge of the substrate and discharging a coating liquid containing a coating film component and a solvent, while rotating the substrate horizontally held, to spirally apply the coating liquid to form a coating film on the substrate; a monitoring step of monitoring the state of the surface of the substrate in a coated region to detect an uncoated region generated in the coated region in which the coating liquid is applied by the nozzle at the first coating step; and a second coating step of applying the coating liquid so as to fill the uncoated region with the coating liquid by the nozzle when the uncoated region is detected at the monitoring step.

According to such a method, it is possible to surely fill the coating liquid in the uncoated region which is easily generated when the coating liquid is spirally applied, so that it is possible to enhance the inplane uniformity of the thickness of the coating film. Specifically, separate nozzles are preferably prepared for the first and second coating steps, and the monitoring step is preferably a step of monitoring the surface of the substrate in the vicinity of a position just below the nozzles. Thus, when the uncoated region is detected, it is possible to carry out the second coating step without waiting the end of the first coating step, so that it is possible to improve throughput.

The monitoring step is preferably a method for detecting the uncoated region by irradiating the surface of the substrate with light and monitoring the intensity of reflected light, or a method for detecting the uncoated region by monitoring a difference in level on the surface of the coating liquid which is applied on the substrate.

According to the present invention, the first coating step may be a step carried out on the basis of coating data including a rotation-speed pattern indicative of the relationship between the position of the nozzle and the speed of rotation of the substrate at that position, and a traveling pattern indicative of the relationship between the position of the nozzle and the traveling speed of the nozzle at that position, and the coating film forming method may include a data modifying step of modifying the coating data so as not to generate the uncoated region at the same place when the uncoated region is detected at the monitoring step. This data modifying step is preferably a step of determining that the setting of the coating data is erroneous when the uncoated region is continuously detected two times at the same place of a plurality of substrates at the monitoring step, and modifying a rotation pattern so that the speed of rotation of the substrate increases during the whole time in which the coating liquid is applied, when it is determined that the coating data is erroneous. In addition, the coating data modified at the data modifying step changes in accordance with a position on the substrate at which the uncoated region is detected.

A coating film forming system according to the present invention comprises: a substrate holding portion for horizontally holding and rotating a substrate; a main nozzle for spirally applying a coating liquid containing a component of a coating film and a solvent on the surface of the substrate to form the coating film thereon, the main nozzle moving between a central portion and outer edge portion of the substrate held on the substrate holding portion; monitoring means for monitoring the state of the surface of the substrate in a coated region to detect an uncoated region generated in the coated region in which the coating liquid is applied by the main nozzle; and an auxiliary nozzle for applying the coating liquid so as to fill the uncoated region with the coating liquid when the monitoring means detects the uncoated region generated in the coated region.

With such a construction, the main nozzle is preferably formed so as to integrally move with the monitoring means.

The coating film forming system may further comprise data modifying means for modifying coating data on the basis of the coating data including a rotation-speed pattern indicative of the relationship between the position of the first nozzle and the speed of rotation of the substrate when the first nozzle exists at that position, and a traveling pattern indicative of the relationship between the position of the first nozzle and the traveling speed of the first nozzle at that position, so as not to generate the uncoated region at the same place when the uncoated region is detected by the monitoring means.

BEST MODE FOR CARRYING OUT THE INVENTION

Figure 1:
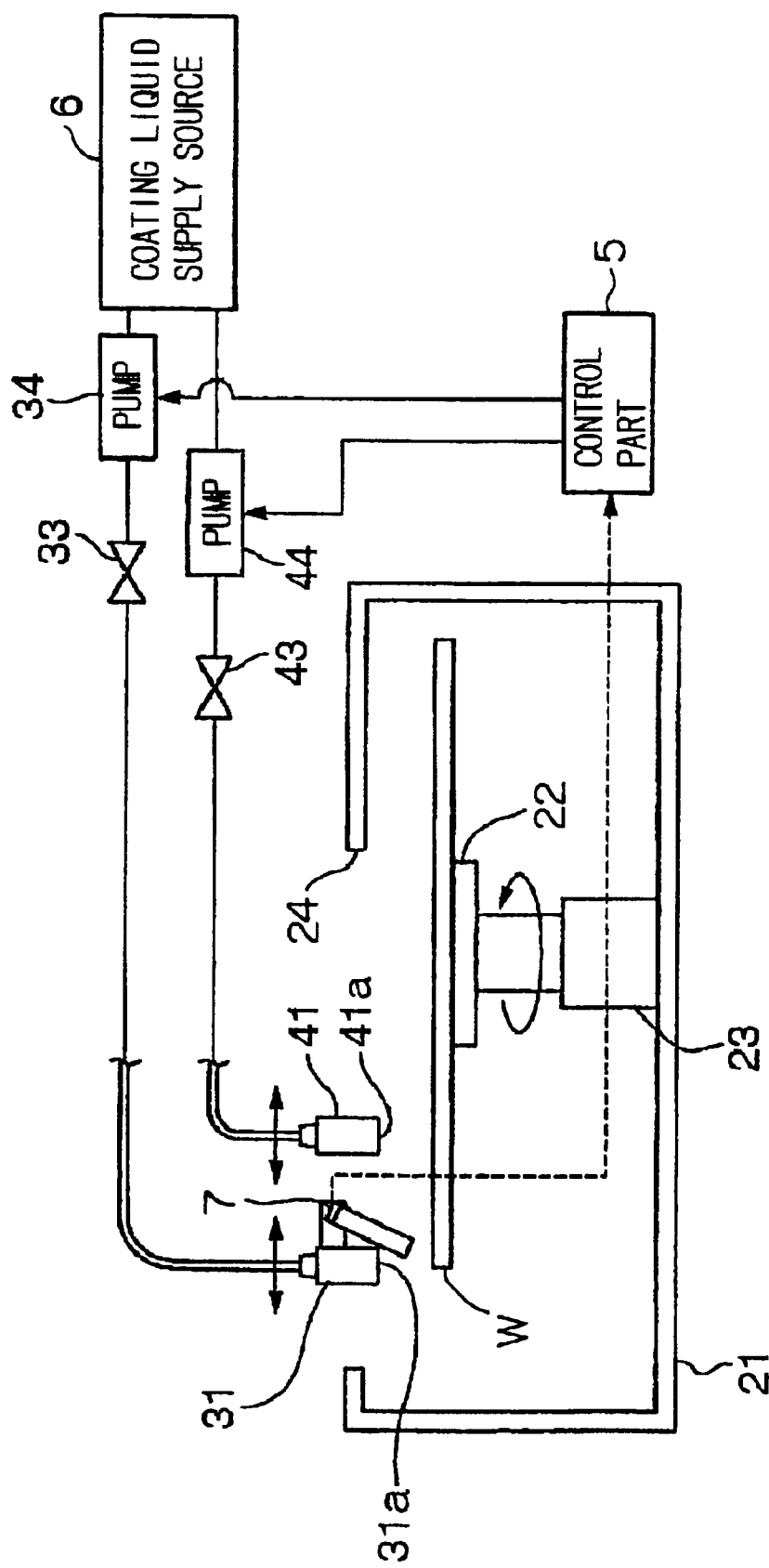
FIG. 1 is a longitudinal sectional view showing a system for carrying out a coating film forming method according to the present invention.

An example of a system for carrying out a coating film forming method according to the present invention will be described below. First, referring to FIGS. 1 and 2, the whole construction of this system will be described. In the figure, reference 21 is a hollow casing body wherein an opening (not shown) for carrying a wafer W being a substrate in and out of the casing body is formed in, e.g., the side thereof. In the casing body, there are provided a wafer holding part 22 for vacuum-holding the reverse face of the wafer W and for horizontally holding the wafer W, and a rotating mechanism 23 for supporting thereon the bottom of the wafer holding part 22 and for rotating the wafer holding part 22 about a vertical axis thereof during coating.

In the ceiling portion of the casing body 21, a slit 24 extending in X directions is formed. Above the slit 24, a main nozzle 31 and auxiliary nozzle 41 for supplying a coating liquid, such as a polyimide solution, to the wafer W are provided. The main nozzle 31 and the auxiliary nozzle 41 are held by driving mechanisms 32 and 42, respectively, in such a state that the discharge holes 31a and 41a in the tips of the bottom end portions protrude in the casing body 21 via the slit 24, and independently move in X directions. Although the details of the auxiliary nozzle 41 will be described later, the auxiliary nozzle 41 is designed to supply the coating liquid to an uncoated region generated within a range to which the coating liquid has been supplied by the main nozzle. Therefore, both of the nozzles do not only have substantially the same construction, but liquid supply systems (which will be described later) for the respective nozzle also have substantially the same construction. For example, the diameter of the discharge holes 31a and 41a is about 100 $\mu$m, and the main and auxiliary nozzles are designed to discharge the coating liquid to the surface of the wafer W at a flow rate of 0.05 milliliter/sec from a height of 10 mm above the wafer W. The rotating mechanism 23 and the driving mechanisms 32 and 42 are connected to a control part via a controller (not shown), respectively, and are designed to be driven in accordance with control signals from the control part 5.

Figure 2:
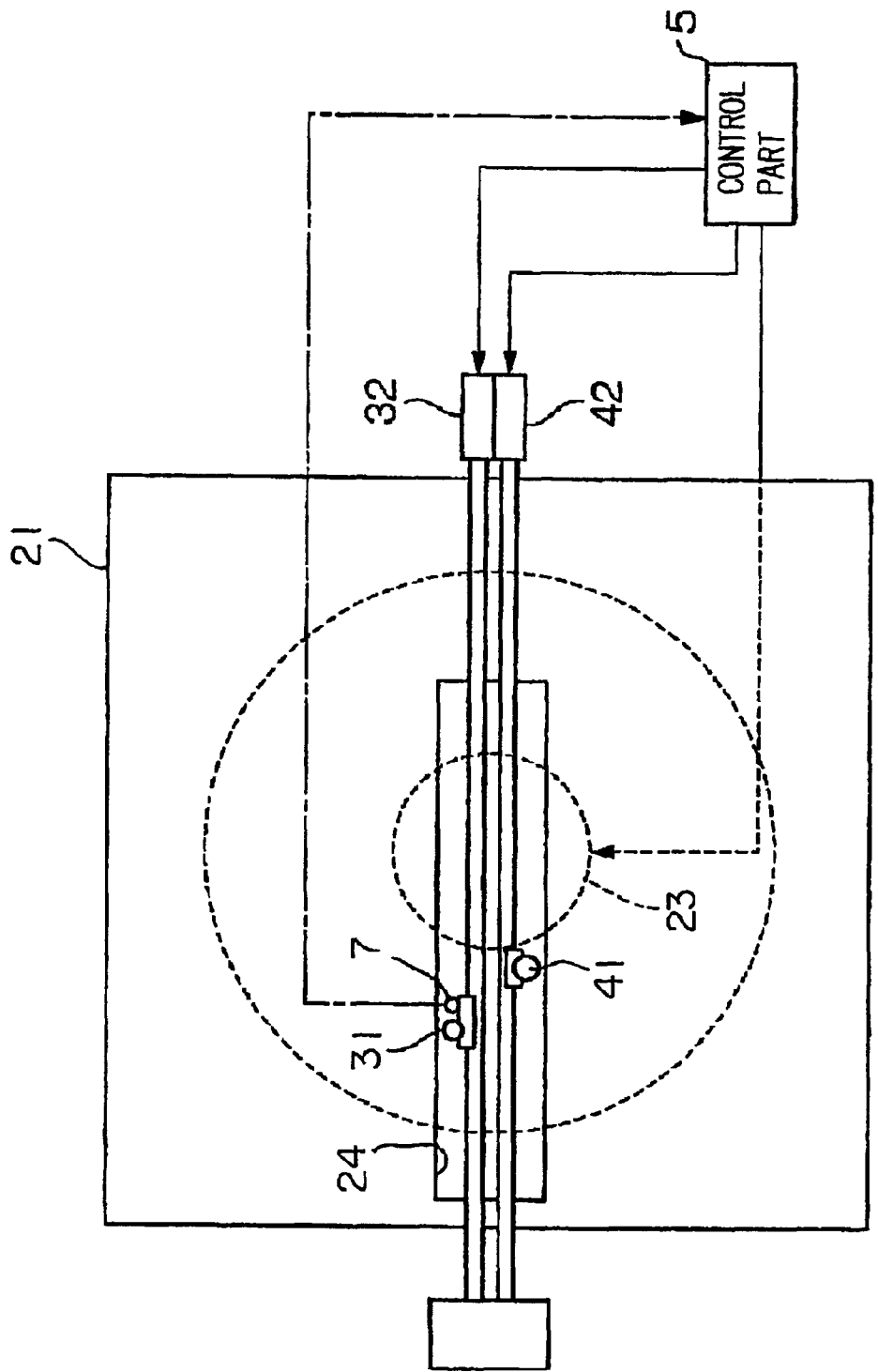
FIG. 2 is a plan view showing a system for carrying out a coating film forming method according to the present invention.

Referring to FIG. 1, the construction of the liquid supply system in this preferred embodiment will be described below. The base end portions of the main nozzle 31 and the auxiliary nozzle 41 are connected to a coating liquid supply source 6. Between the main nozzle 31 and the coating liquid supply source 6, a valve 33 and a pump 34 are provided. Between the auxiliary nozzle 41 and the coating liquid supply source 6, a valve 43 and a pump 44 are provided. The coating liquid supply source 6 stores therein, e.g., a polyimide solution containing a component of a coating film, such as a polyimide component, which is dissolved in a solvent, such as NMP (N-methylpyrolidone). The pumps 34 and 44 are connected to the control part 5 via the controller (not shown). By controlling the pumps 34 and 44 from the control part 5, the rates of discharge in the main nozzle 31 and auxiliary nozzle 41 can be adjusted.

With such a construction, the pumps 34 and 44 comprise, e.g., be bellows pumps. The bellows pump is a pump for changing the timings in sucking and discharging liquid by the telescopic motion of bellows, and the telescopic motion thereof is carried out by, e.g., a stepping motor. Therefore, for example, the range of the telescopic motion of bellows is changed by controlling the stepping motor by the control part 5, so that the rate of discharge of the polyimide solution is adjusted. Furthermore, in this preferred embodiment, the parts, such as the bellows and stepping motor, for adjusting the rates of discharge of the coating liquid in the pumps 34 and 44, are not shown in the figure.

For example, on the side of the main nozzle 31, there is provided a monitoring means 7 for monitoring the state of the surface of the wafer W and for detecting whether an uncoated region has been generated in a region (a coated region) in which the coating liquid has been applied on the wafer W. For example, this monitoring means 7 is designed to monitor the line of the coating liquid, which is supplied to the surface of the wafer W from the main nozzle 31, and the vicinity of the line on the left and right sides to detect whether the uncoated region exists on the line of the coating liquid or in an adjacent region. Specifically, the monitoring means 7 may comprise a system for detecting the uncoated region on the basis of a difference in level by means of, e.g., a laser displacement meter, or a system for irradiating the wafer W with laser beams by means of, e.g., a red LED, to detect the uncoated region on the basis of the reflected light which is reflected on the underlayer below the wafer W. Data which is obtained from the monitoring means 7 and which relates to the state of the surface of the wafer W is transmitted to the control part 5, and the driving of the auxiliary nozzle 41 and the flow rate of the pump 44 are controlled on the basis of the data.

Figure 3:
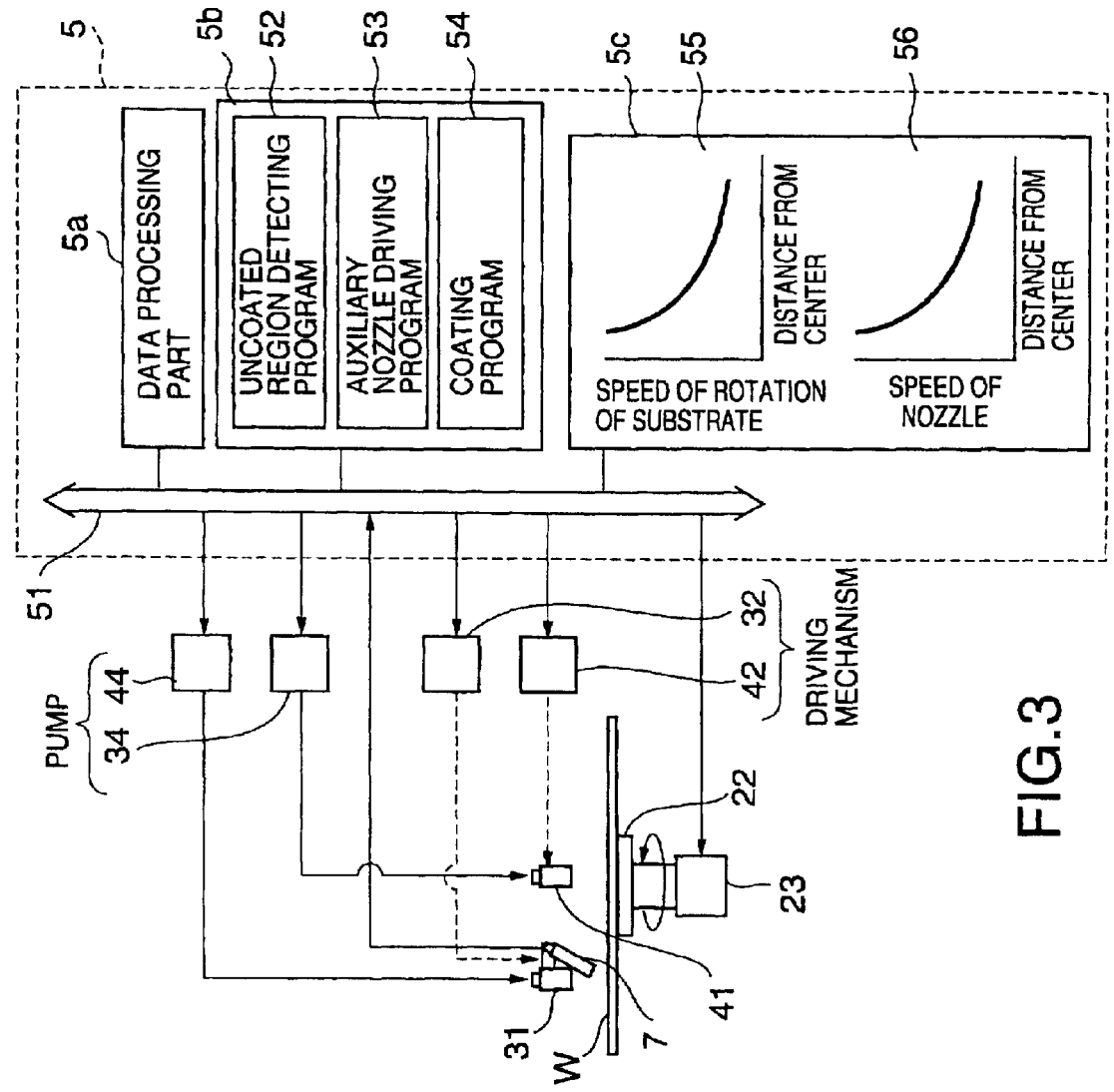
FIG. 3 is an illustration for explaining the whole construction of a control part with respect to the system.

Referring to FIG. 3, the above described control part 5 will be described below. In the figure, the principal parts of the control part 5 are shown as blocks. The respective parts of the control part 5 generally comprising a data processing part 5a, a program storing part 5b and a memory 5c are designed to transmit and receive signals via a bus 51. The above described rotating mechanism 23, driving mechanisms 32 and 42, pumps 34 and 44 and monitoring means 7 which are objects to be controlled are connected to the control part 5 via the bus 51, and are designed to receive and transmit signals from and to the respective blocks via control units (not shown) which are provided therein, respectively.

The program storing part 5b stores therein: an uncoated region detecting program 52 for determining whether an uncoated region is generated, on the basis of data which is transmitted from, e.g., the monitoring means 7, and which is obtained by monitoring the state of the surface of the wafer W, and for calculating the starting point, length and so forth of, e.g., the uncoated region, in order to grasp the shape of the uncoated region; an auxiliary nozzle driving program 53 for controlling the driving mechanism 42 and the pump 44 when the coating liquid is supplied to the uncoated region by means of the auxiliary nozzle 41; and a coating program for controlling the rotating mechanism 23, the driving mechanism 32 and the pump 34 when the coating liquid is spirally applied by means of the main nozzle 31.

The memory 5c stores therein a plurality of coating data which is referred to when the coating program 54 is executed. One of the coating data comprises a rotation-speed pattern 55 of the wafer W and a traveling pattern 56 of the main nozzle 31, which have been previously prepared every, e.g., a target thickness. As shown in the figure, the rotation-speed pattern 55 defines the relationship between the position of the main nozzle 31 (a distance from the center of the wafer W) and the speed of rotation of the wafer W when the main nozzle 31 is positioned at that position, and the traveling pattern 56 defines the relationship between the position of the main nozzle 31 and the traveling speed of the main nozzle 31 in radial directions when the main nozzle 31 is position at that position. The sets of the coating data are determined on the basis of, e.g., experiments which have been previously carried out, so that the lines of the coating liquid applied from the central portion of the wafer W to the outer edge thereof are tightly arranged when the coating liquid is spirally applied on, e.g., the surface of the wafer W.

The operation of the above described preferred embodiment will be described below. First, the wafer W is carried in a predetermined position above the wafer holding part 22 by a conveying means (not shown), and thereafter, the reverse surface of the wafer W is absorbed onto the wafer holding part 22 to be substantially horizontally held. On the other hand, the coating liquid supply source 6 mixes a polyimide solution with a solvent at a predetermined ratio in a mixing part (not shown) to adjust an appropriate concentration of coating liquid.

Then, the operator executes the coating program 54 to rotate the wafer W at a predetermined speed of rotation on the basis of the respective data of the rotation-speed data 55 and traveling pattern 56 of the coating data selected from the memory 5c by the coating program in accordance with, e.g., the target thickness of the coating film, and to position the main nozzle 31 above the center of the wafer W to open the valve 33 to start to discharge a predetermined amount of coating liquid to gradually move the nozzle 31 from the center of the wafer W toward the peripheral edge thereof. Thus, the coating liquid is applied on the surface of the wafer W while drawing a spiral pattern thereon.

The above described step corresponds to a first coating step as set forth in claims. Assuming herein that the applying direction of the coating liquid on the wafer W is forward, the monitoring means 7 monitors the state of the surface, e.g., slightly in the rear of a position directly below the main nozzle 31. Therefore, referring to the flow chart of FIG. 4, respective steps, such as measures when an uncoated region is detected after monitoring, will be described below. Furthermore, it is herein assumed that the rates of discharge of the coating liquid in the main nozzle 31 and auxiliary nozzle 41 are always constant and that the width of the uncoated region P is substantially equal to the line width of the coating liquid Q as shown in FIG. 5.

Figure 6:
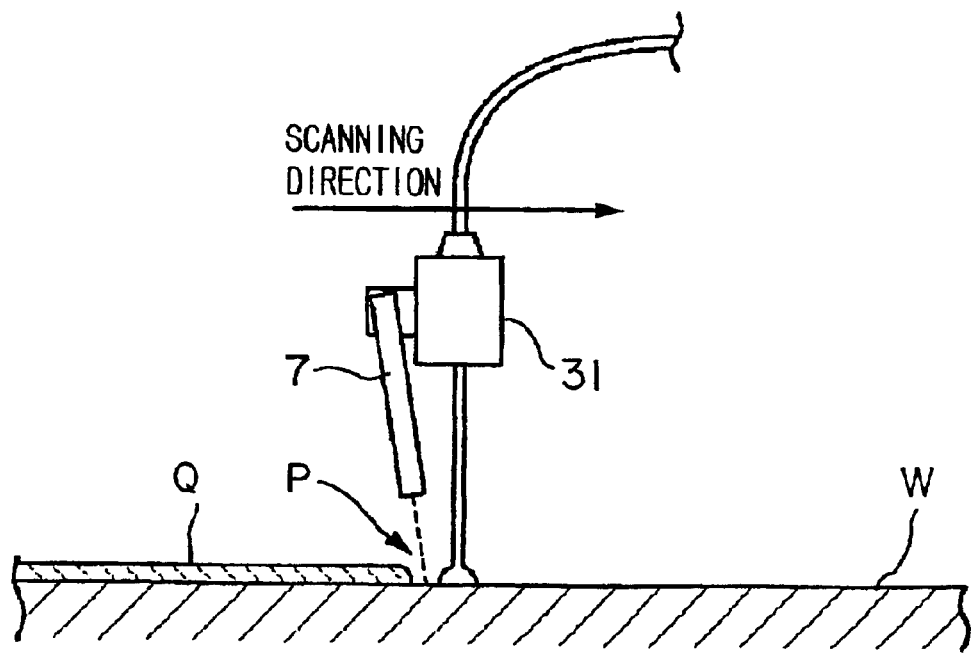
FIG. 6 is an illustration for explaining the operation of a main nozzle and a monitoring means.

First, by the monitoring means 7, the difference in level on the surface of the coating liquid Q is monitored by, e.g., a laser displacement meter, as shown in FIG. 6, and the thickness of the coating liquid Q in the monitoring portion is detected on the basis of the difference from the shape of the surface of the wafer W which has been previously revealed, to determine whether an uncoated region P is generated, on the basis of the detected results (step 1). At this step, even if no coating liquid adheres to the surface of the wafer W or even if bubbles are broken to allow a very small amount of coating liquid to adhere thereto, it is determined that a portion on which the coating liquid is not normally applied is an uncoated region P. If the uncoated region P is detected, 1 is added to a counted value S and the counted value is counted up as long as the uncoated region P exists, at step 2. As described above, the width of the uncoated region P is herein regarded as a constant width, so that the counted value S for recognizing the uncoated region P is in proportion to the length and area as it is. For that reason, for example, a determination whether a coating processing (a second coating step) which will be described later is carried out with respect to the uncoated region P by means of the auxiliary nozzle 41 is carried out on the basis of the counted value S.

Then, if the uncoated region is not detected by the monitoring means 7, "No" is determined at step 1. At that time, the counted value S, i.e., the length of the uncoated region P, is determined, and it is determined whether the value of S is greater than a set value S1 (step 3). If the value of S does not exceed the set value S1, the uncoated region P is very small, and the counted value S is reset to be zero (step 4). Therefore, it is regarded that the uncoated region is not generated in the region applied by the main nozzle 31, and the first coating step continues to be carried out as it is.

In addition, counting is started again from the state of S=0 in the monitoring means 7. The above description relates to a case where an uncoated point is found by the laser displacement meter. If coating is normally carried out, a loop of step 1→step 2→step 3→step 4 is formed.

On the other hand, if the counted value S exceeds the set value S1, it is determined whether the counted value S is greater than a set value S2 which is set to be a value exceeding the set value S1 (step 5). This step 5 is carried out for determining the abnormality of the system, such as the trouble of the coating liquid supply system, when the uncoated region P generated on the surface of the wafer W is too large, and for informing the operator of it. If the counted value S exceeds the set value S2, an abnormal alarm is generated for informing the operator of the generation of the uncoated region P in which the second coating step can not be carried out (step 6), and thereafter, the counted value is reset to be zero (step 7).

Figure 7:
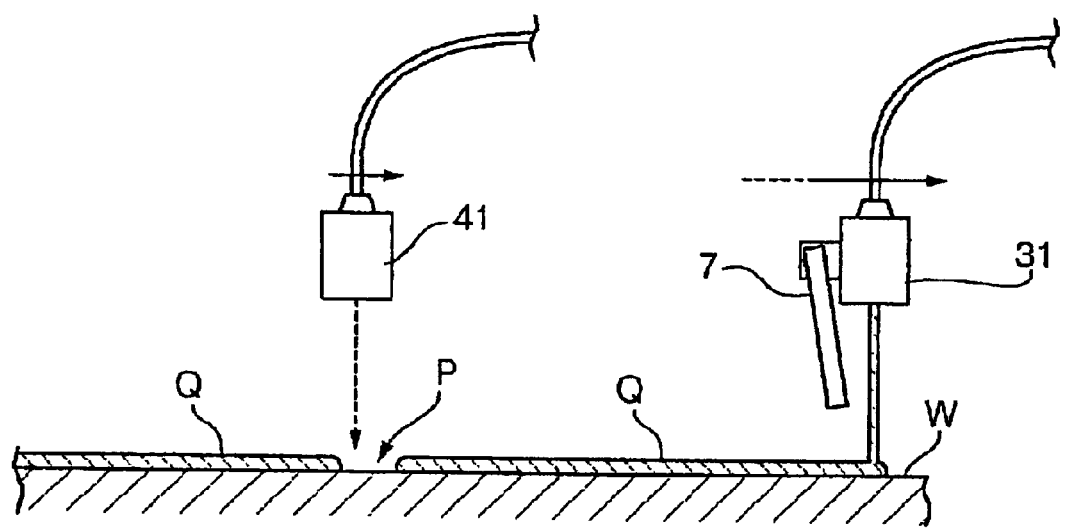
FIG. 7 is an illustration for explaining an auxiliary nozzle.

Then, if the counted value does not exceed S2, the coordinates of the rear end portion (starting point) of the uncoated region P, at which the counting of the counted value S is started, are calculated on the basis of the rotation cycle of the rotating mechanism 23 and the starting time of the counting of the counted value S (step S8), and the length of the uncoated region P is calculated on the basis of the counted value S and the speed of rotation of the wafer W in that portion, so that the shape of the uncoated region P is revealed. Then, on the basis of the auxiliary nozzle driving program 53, coating is carried out in the uncoated region P by the auxiliary nozzle 41 (step 9). However, since the second coating step is started without waiting the end of the first coating step immediately after, e.g., the uncoated region P is detected, the coating liquid is supplied to the uncoated region P by the auxiliary nozzle 41 in a state that the spiral coating continues in the main nozzle 31 as shown in, e.g., FIG. 7, and the counted value S is reset to be zero when coating on the uncoated region P ends (step 10).

As described above, according to this preferred embodiment, the coating liquid is supplied to the surface of the wafer W from the main nozzle 31, and the monitoring means 7 monitors whether the coating liquid is applied as the intention without generating the uncoated region on the surface of the wafer W. Therefore, the second coating step is carried out immediately after the uncoated region on the surface of the wafer W can be detected at the first coating step, so that the uncoated region can be filled with the coating liquid.

In this preferred embodiment, the monitoring means 7 is integrated with the main nozzle, and the monitoring means monitors the surface of the wafer W in the vicinity of a portion just below the main nozzle 31. Therefore, the generation of the uncoated region can be detected immediately after the coating liquid discharged from, e.g., the main nozzle 31, adheres to the surface of the wafer W. In addition, the second coating step carried out when the monitoring means 7 detects the uncoated region is carried out by the auxiliary nozzle 41 provided separately from the main nozzle 31. Therefore, the second coating step using the auxiliary nozzle 41 can be carried out in parallel to the first coating step without waiting the end of the first coating step using the main nozzle 31, so that throughput can be improved.

Moreover, if the time from the detection of the uncoated region to the starting of the second coating step is long, the volatilization of the solvent contained in the coating liquid which has been applied starts, the degree of volatilization of the solvent in the coated portion at the first coating step is different from that in the coated portion at the second coating step, so that there are some cases where the inplane uniformity of the thickness of the coating film deteriorates. However, in this preferred embodiment, the second coating step can be rapidly carried out after the detection of the uncoated region, so that there is an advantage in that it is possible to avoid the occurrence of the above described problems.

Figure 8:
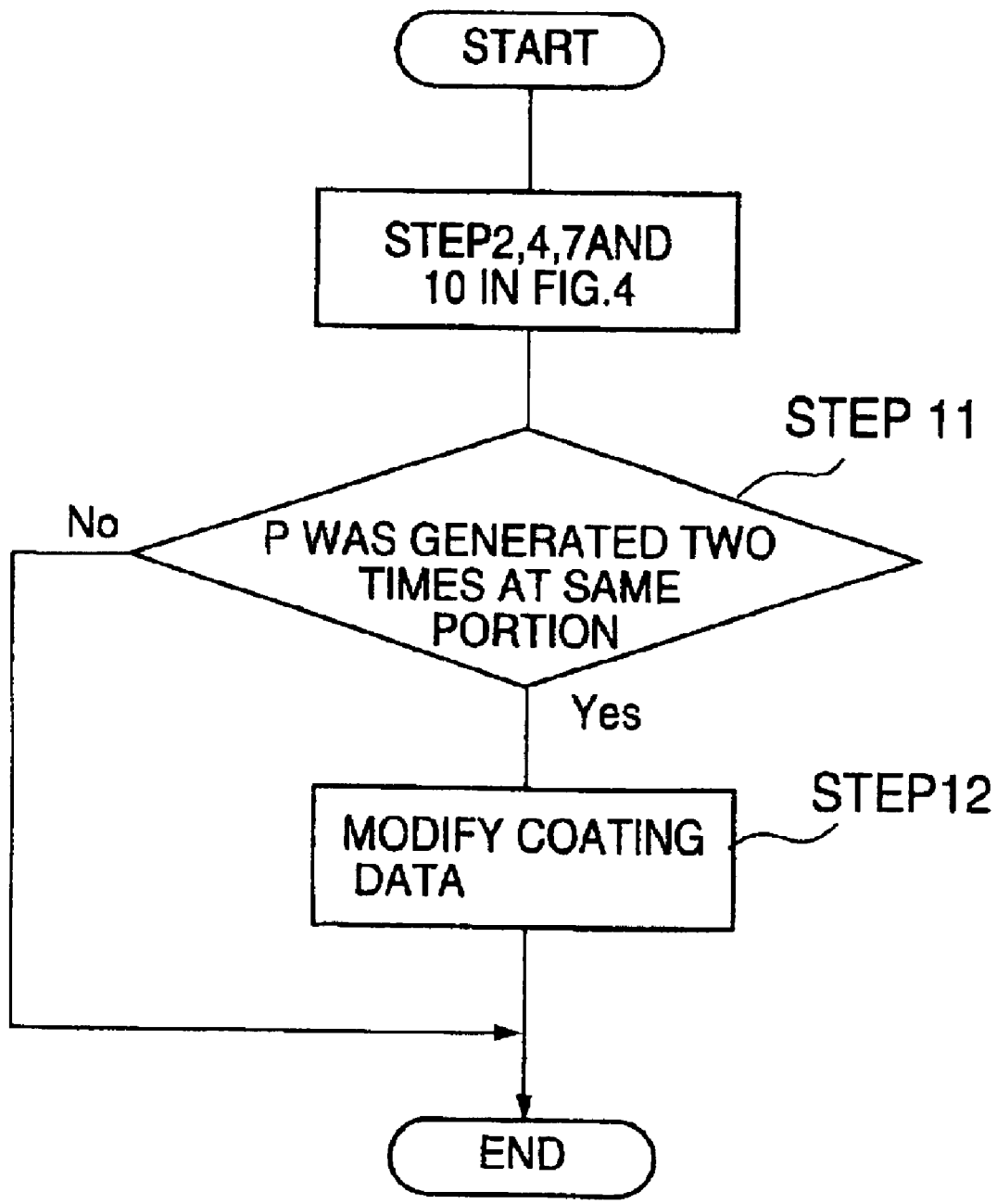
FIG. 8 is a flow chart for explaining another preferred embodiment of a coating film forming method according to the present invention.

By the way, in the above described preferred embodiment, it is possible to take measures to carry out the second coating step to fill the coating liquid in any one of the uncoated region generated by breaking the line of the coating liquid and the linear uncoated region generated by the setting failure of the coating data or the like. With respect to the latter of the above described coated regions, the occurrence of the uncoated region can be suppressed by reviewing, e.g., the coating data. Therefore, referring to the flow chart of FIG. 8, a preferred embodiment for modifying coating data in case where a liner uncoated region is generated will be described below.

Figure 4:
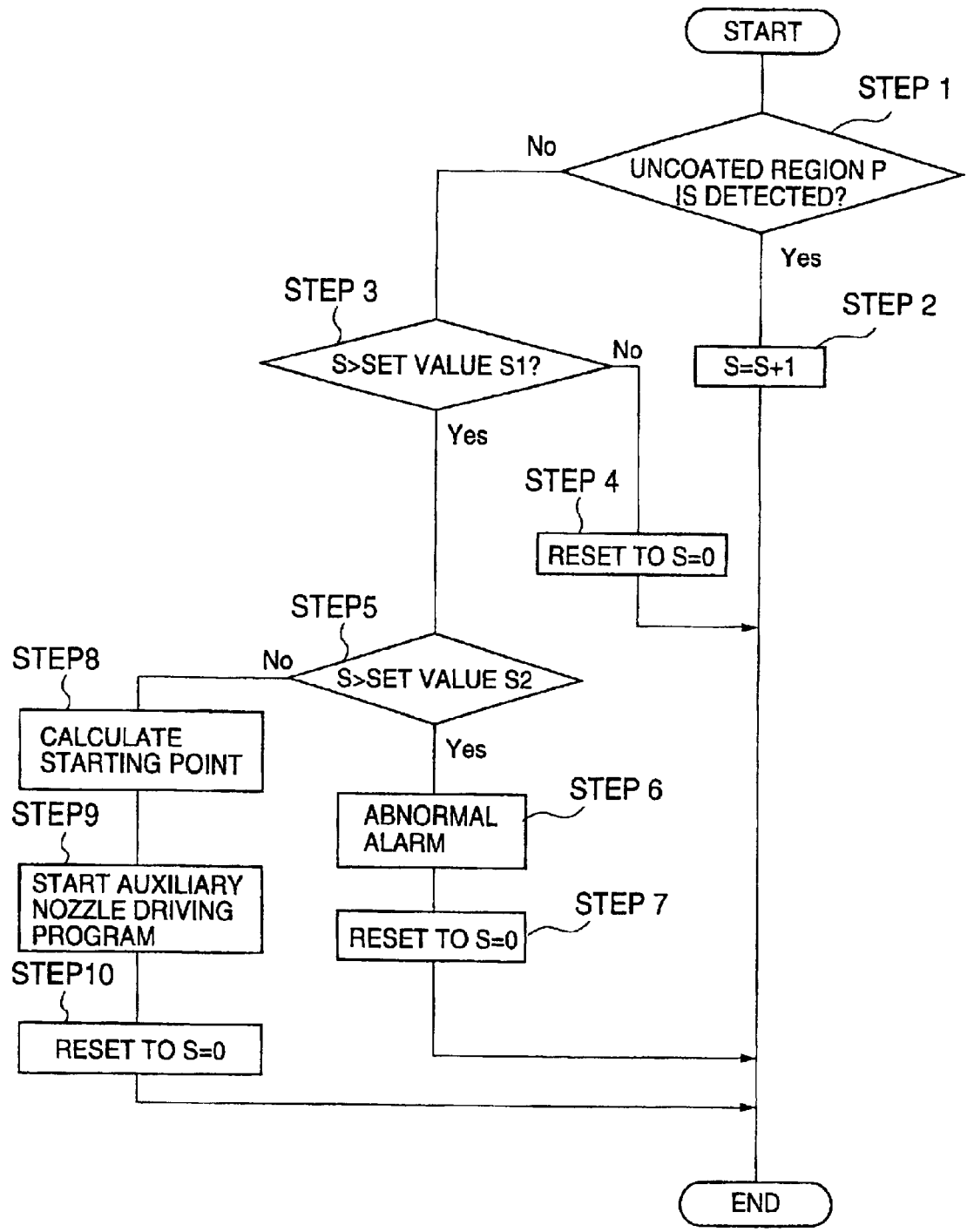
FIG. 4 is a flow chart for explaining a second coating step according to the present invention.
Figure 5:
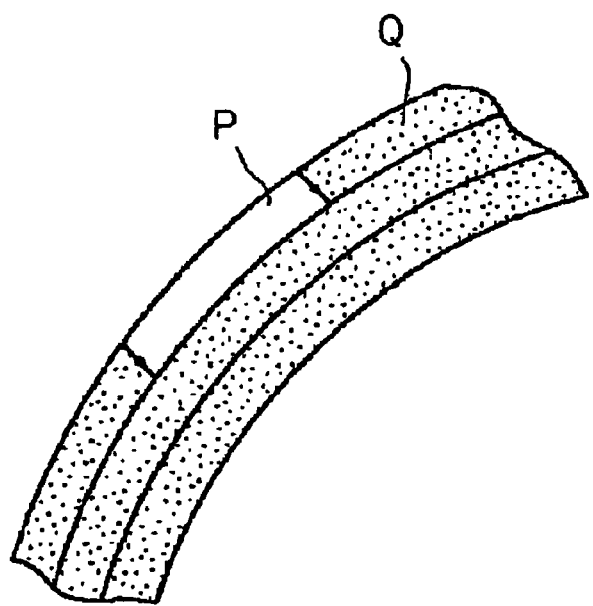
FIG. 5 is a schematic plan view for explaining the shape of an uncoated region P.

First, in the above described preferred embodiment, the counted value S continuously increases while the monitoring means 7 continues to detect the uncoated region P at, e.g., step 2 in FIG. 4. At this time, the control part 5 grasps data every wafer W whether the uncoated region P is generated in which portion of the surface of the wafer W, so that it is determined whether the uncoated region P is continuously generated in the same portion two times (step 11). Then, when the uncoated region P is not detected in the same place of the next wafer W although the uncoated region P is generated in a wafer W, the coating data is not modified, and if it is continuously two times, it is determined that the setting of the coating data is erroneous, so that the coating data is modified (step 12).

Figure 9A:
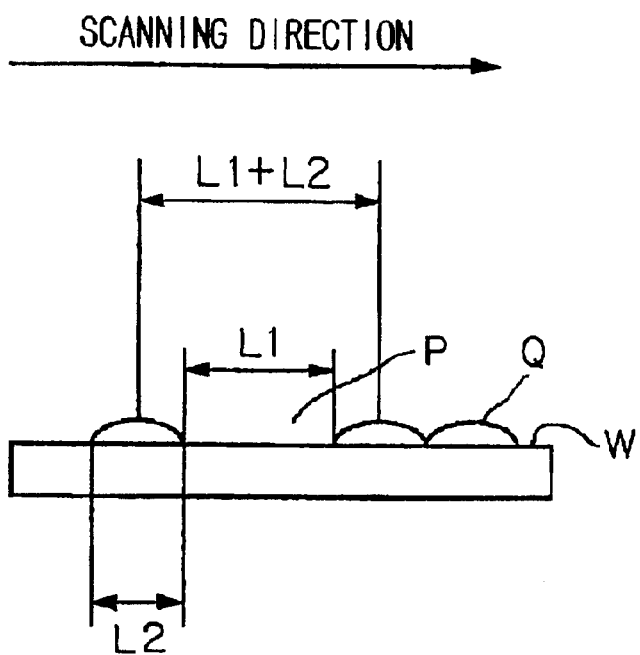
FIG. 9 is an illustration for explaining modification of the coating data in the other preferred embodiment.
Figure 9B:
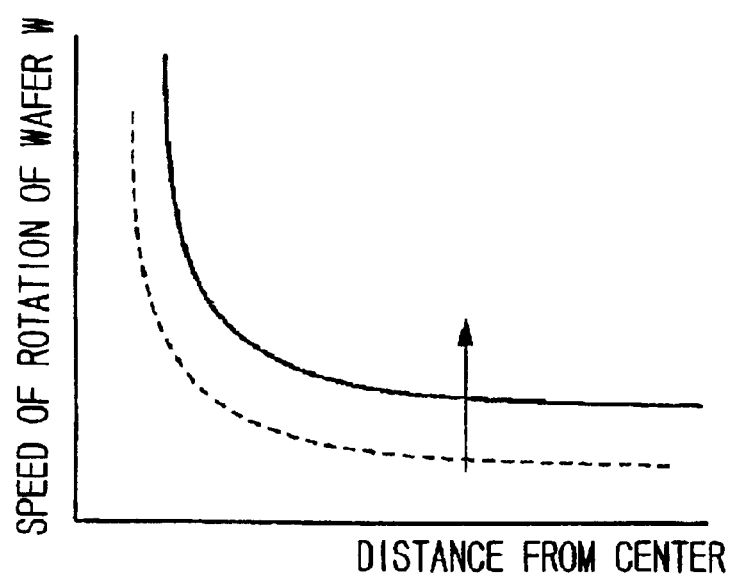

As described above, the coating data includes the rotation-speed pattern 55 of the wafer W and the traveling pattern 56 of the main nozzle 31. An example of a method for modifying only the rotation-speed pattern 55 will be described below. The linear uncoated region is generated since the speed of rotation in that portion is lower than that when the lines of the coating liquid are tightly arranged. For example, as shown in the longitudinal sectional view of FIG. 9(a), assuming that the width of the uncoated region P is L1 and the line width of the coating liquid is L2, the coating liquid must be applied toward the outer edge by L2 while the wafer W makes one rotation in order for the lines of the coating liquid to be tightly arranged. However, in a portion in which the uncoated region P is detected, the coating liquid moves toward the outer edge by L1+L2, so that it can be seen that the speed of rotation lags by L1. Therefore, a rotation-speed curve at a position shown by a dotted line as shown in, e.g., FIG. 9(b), is raised to a position shown by a solid line as a whole so that the speed of rotation per unit time in the portion is (L1+L2)/L2 times, and the modified rotation-speed curve is stored in the memory 5c again. Then, the modified rotation-speed curve is used for carrying out a coating processing with respect to and after the next wafer W.

Furthermore, the coating liquid discharged from the nozzle is discharged at a constant amount. Therefore, in order to uniformly apply the coating liquid on the whole surface of the wafer W, it is required to decrease the speed of rotation at a position at which the distance from the center of the wafer W and the radius of rotation thereof are larger when the nozzle is moved at a uniform velocity, and the speed of rotation of the wafer W per unit time hyperbolically changes with respect to the radius of rotation as shown in FIG. 9(b). Therefore, the value obtained by multiplying the speed of rotation per unit time by (L1+L2)/L2 varies in accordance with the position of a portion at which the uncoated region P has been detected.

According to such a preferred embodiment, since it is possible to verify whether the uncoated region detected by the monitoring means 7 is based on the setting failure of coating data or accidentally generated, it is not required to frequently review the coating data, so that throughput is improved.

While the example where the rates of discharge of the coating liquid in the main nozzle 31 and auxiliary nozzle 41 are constant has been described above, the rates of discharge may be changed by changing, e.g., a pump pressure or a nozzle diameter. Thus, it is possible to supply a more appropriate amount of coating liquid to the uncoated region without waste.

In the above described preferred embodiment, immediately after coating is carried out by the main nozzle 31, the uncoated region is detected, and the second coating step is carried out. Therefore, the interval therebetween is short, and the processing is carried out by assuming that the speed of rotation of the wafer W when the uncoated region is generated is the same as the speed of rotation when the second coating step is carried out. In fact, the speed of rotation of the wafer W varies in accordance with the position just below the nozzle as shown by the rotation-speed pattern 55 in FIG. 4, so that the rate of discharge and discharge time in the auxiliary nozzle 4 may be adjusted so as to adapt thereto.

In this preferred embodiment, the uncoated region may be filled by the main nozzle 31 without the need of the auxiliary nozzle 41.

Figure 10:
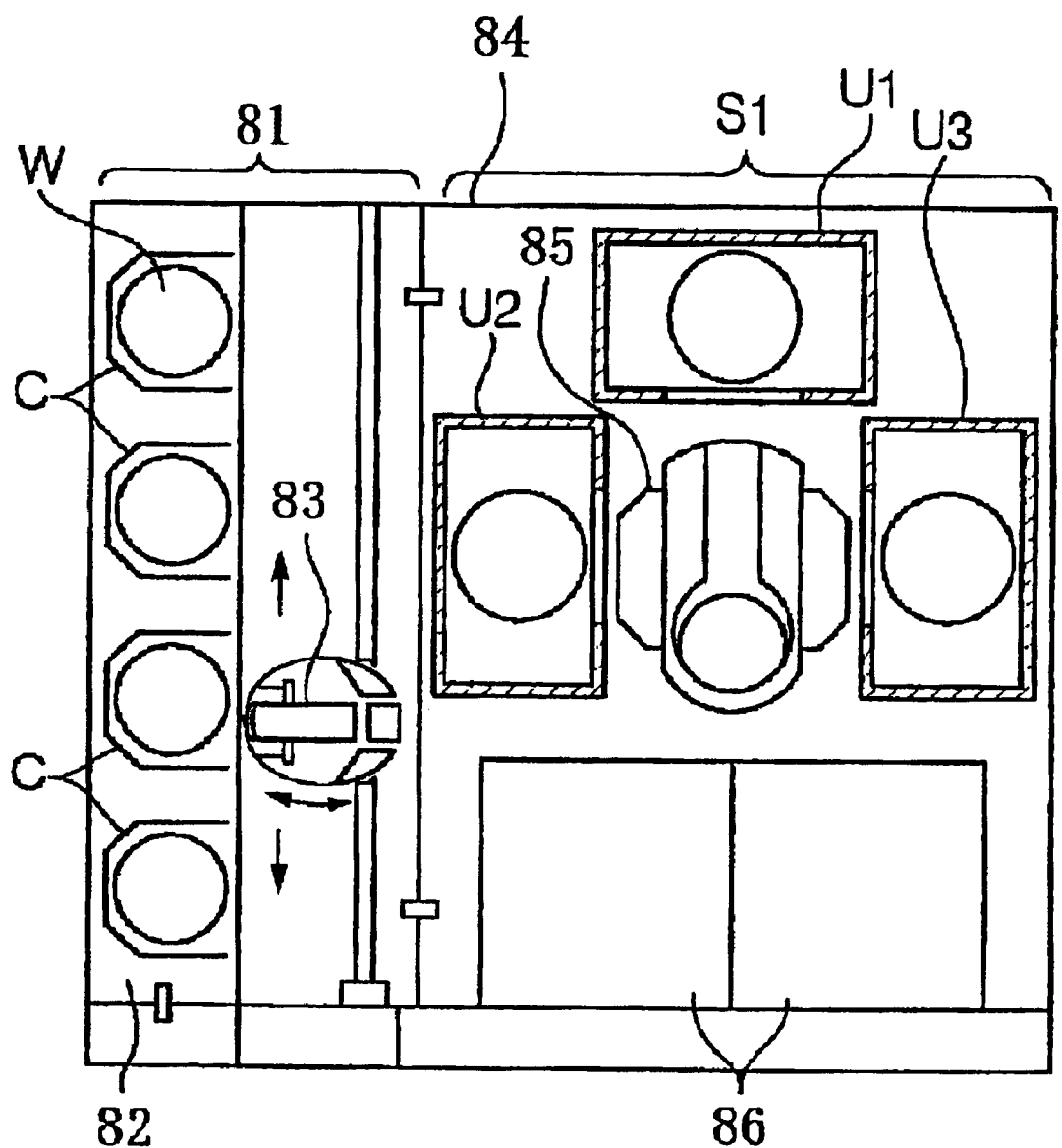
FIG. 10 is a plan view showing an example of a substrate processing system including a system for carrying out the coating film forming method.
Figure 11:
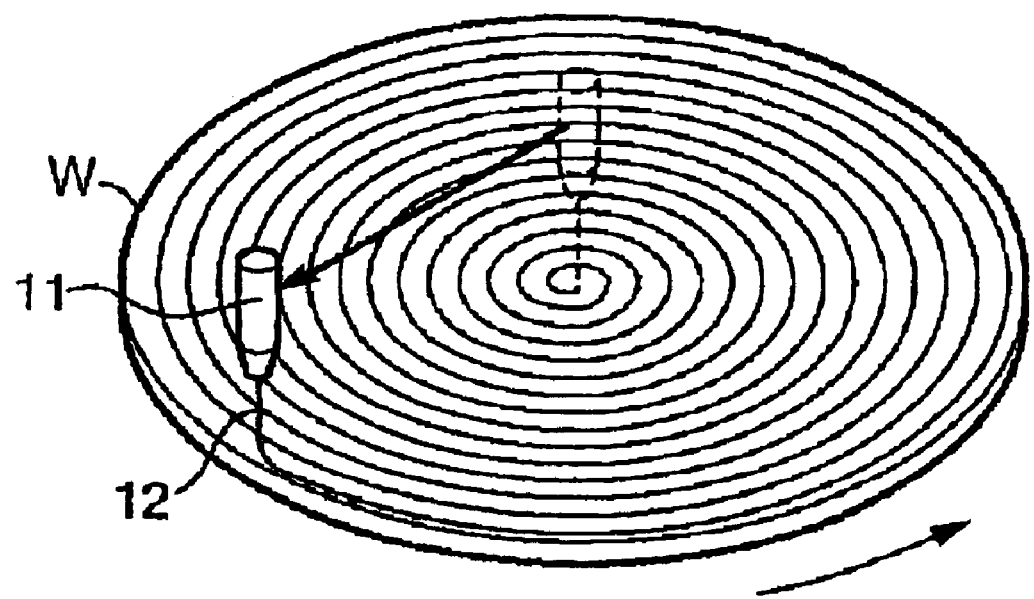
FIG. 11 is an illustration showing the spiral coating of a coating liquid in the prior art.

Referring to FIG. 10, a substrate processing system wherein a coating unit includes the above described coating film forming system will be briefly described below. In the figure, reference number 81 denotes a cassette station, and is provided with a cassette mounting part 82 for mounting thereon a cassette C in which, e.g., 25 wafers W, are housed, and a delivery arm 83 for delivering the wafer W from and to the mounted cassette C. Inside of the delivery arm 83, a processing part S1 surrounded by a housing 84 is connected. At the center of the processing part S1, a main conveying means 85 is provided. A plurality of coating units 86 are arranged on the right side, and shelf units U1, U2 and U3 formed by stacking heating and cooling units in multiple stages are arranged on the left side, the front side and inside, so that the main conveying means 85 is surrounded by the plurality of units 86 and the shelf units U1, U2 and U3.

The shelf units U1, U2 and U3 are formed by combining various units for carrying out a pre-treatment and a post-treatment for the coating unit 86, and include, e.g., a reduced-pressure drying unit for drying the wafer W, on which a coating liquid is applied by the coating unit 86, in a reduced-pressure atmosphere to volatilize a solvent contained in the coating liquid, a heating unit for heating (baking) the wafer W, and a cooling unit for cooling the wafer W. Furthermore, the shelf units U2 and U3 also include a delivery unit having a delivery table for delivering the wafer W. For example, the above described main conveying means 85 is movable vertically, forward and rearward and rotatable about a vertical axis, and can deliver the wafer W between the respective units constituting the coating unit 86 and the shelf units U1, U2 and U3.

As described above, according to the coating film forming method and system according to the present invention, it is possible to enhance the inplane uniformity of the thickness of the coating film and improve throughput when the coating film is formed on the substrate.

What is claimed is:

1. A coating film forming system comprising:
a substrate holding portion for horizontally holding and rotating a substrate;
a main nozzle for spirally applying a coating liquid containing a component of a coating film and a solvent on the surface of said substrate to form the coating film thereon, said main nozzle moving between a central portion and outer edge portion of said substrate held on said substrate holding portion;
monitoring means for monitoring the state of the surface of said substrate in a coated region to detect an uncoated region generated in the coated region in which the coating liquid is applied by said main nozzle; and
an auxiliary nozzle for applying said coating liquid so as to fill said uncoated region with said coating liquid when said monitoring means detects said uncoated region generated in said coated region.

2. A coating film forming system as set forth in claim 1, wherein said main nozzle is formed so as to integrally move with said monitoring means.

3. A coating film forming system as set forth in claim 1, which further comprises data modifying means for modifying coating data on the basis of said coating data including a rotation-speed pattern indicative of the relationship between the position of said first nozzle and the speed of rotation of said substrate when said first nozzle exists at that position, and a traveling pattern indicative of the relationship between the position of said first nozzle and the traveling speed of said first nozzle at that position, so as not to generate said uncoated region at the same place when said uncoated region is detected by said monitoring means.

* * * * *